US008737148B2

United States Patent
Byom et al.

(10) Patent No.: US 8,737,148 B2
(45) Date of Patent: *May 27, 2014

(54) SELECTIVE RETIREMENT OF BLOCKS

(71) Applicant: Apple Inc., Cupertino, CA (US)

(72) Inventors: Matthew J. Byom, San Jose, CA (US); Daniel J. Post, Campbell, CA (US); Vadim Khmelnitsky, Foster City, CA (US)

(73) Assignee: Apple Inc., Cupertino, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/833,229

(22) Filed: Mar. 15, 2013

(65) Prior Publication Data

US 2013/0212344 A1    Aug. 15, 2013

Related U.S. Application Data

(63) Continuation of application No. 12/842,477, filed on Jul. 23, 2010, now Pat. No. 8,411,519.

(60) Provisional application No. 61/351,381, filed on Jun. 4, 2010.

(51) Int. Cl.
*G11C 29/00* (2006.01)

(52) U.S. Cl.
USPC ......... 365/200; 365/230.03; 714/42; 714/718

(58) Field of Classification Search
USPC ........................ 365/200, 230.03; 714/42, 718
See application file for complete search history.

(56) References Cited

U.S. PATENT DOCUMENTS

| | | | |
|---|---|---|---|
| 7,362,613 B2 * | 4/2008 | Conley et al. | ............ 365/185.11 |
| 7,532,511 B2 | 5/2009 | Conley et al. | |
| 7,945,826 B2 * | 5/2011 | Kameda et al. | ................ 714/723 |
| 8,156,392 B2 | 4/2012 | Flynn et al. | |
| 8,370,603 B2 * | 2/2013 | Toelkes et al. | ................. 711/202 |
| 8,411,519 B2 * | 4/2013 | Byom et al. | ................... 365/200 |
| 2005/0190615 A1 | 9/2005 | Linde et al. | |
| 2008/0052446 A1 | 2/2008 | Lasser et al. | |

* cited by examiner

*Primary Examiner* — Toan Le
(74) *Attorney, Agent, or Firm* — Van Court & Aldridge LLP

(57) ABSTRACT

Systems and methods are provided for selectively retiring blocks based on refresh events of those blocks. In addition to refresh events, other criteria may be applied in making a decision whether to retire a block. By applying the criteria, the system is able to selectively retire blocks that may otherwise continue to be refreshed.

13 Claims, 10 Drawing Sheets

SELECTIVE RETIREMENT OF BLOCKS

CROSS-REFERENCE TO A RELATED APPLICATION

This application is a continuation of U.S. patent application Ser. No. 12/842,477, filed Jul. 23, 2010 (now U.S. Pat. No. 8,411,519 which claims the benefit of U.S. Provisional Patent Application No. 61/351,381, filed Jun. 4, 2010, the disclosures of which are incorporated by reference herein in their entirety.

FIELD OF THE INVENTION

This can relate to systems and methods for selectively retiring blocks of non-volatile memory such as NAND flash memory.

BACKGROUND OF THE DISCLOSURE

NAND flash memory, as well as other types of non-volatile memories ("NVMs"), are commonly used in electronic devices for mass storage. For example, consumer electronics such as portable media players often include flash memory to store music, videos, and other media.

Electrically programmable and erasable non-volatile memories, such as NAND flash, can store charge in transistors (which are sometimes referred to as cells). The transistors can be constructed to be a single bit cell (sometimes referred to as a single level cell (SLC)) or a multi bit cell (sometimes referred to as multi level cell (MLC)). These cells are packaged together to form pages, and the pages are packaged together to form blocks.

Data is stored in the cells and as the cells gain or lose charge, they may experience a bit flip. Bit flips can be caused by any number of reasons, including, for example, read disturbs (which can add charge), timely retention (which can result in loss of charge), and physical failure of the die. Bit flips are generally more common in MLC Nand than SLC Nand. Moreover, as Nand lithography continues to shrink, Nand may become even more susceptible to bit flips.

Systems using Nand can compensate for bit flips using any suitable error correction technique, but typically only up to a certain threshold. For example, error correction codes can be used. If the threshold is exceeded, the bit flips cannot be corrected and the data cannot be used. In some situations, however, the system may refresh the Nand before the number of bit flips reaches a point beyond that which can be corrected. A refresh operation restores the cells in a page, a block, or a virtual block to their initially programmed charge states, or to a charge state substantially similar to their initially programmed charge states. While refresh operations are useful for restoring pages, blocks, or virtual blocks to or close to their initially programmed charge states, some cells in a page or block may not physically be capable of retaining charge for a minimum period of time, even after being refreshed. Continuously refreshing such pages or blocks may become a prohibitive maintenance operation.

SUMMARY OF THE DISCLOSURE

Accordingly, systems and methods are disclosed for selectively retiring blocks based on refresh events experienced by those blocks. In addition to refresh events, other criteria may be applied in making a decision whether to retire a block. By applying the criteria, the system is able to selectively retire blocks that may otherwise continue to be refreshed. In one embodiment, blocks may be selectively retired by monitoring blocks that experience refresh events, adding blocks that experience refresh events to a data structure (e.g., a list), maintaining characteristics associated with the blocks in the data structure, applying at least two different criteria to the blocks in the data structure to determine if any one or more of the blocks should be retired, and retiring any blocks that meet the at least two criteria.

In another embodiment, blocks may be selectively retired by maintaining refresh counts of a superblock. A superblock can include a physical block from two or more planes of physical blocks. Each time a superblock is refreshed, a refresh counter for that superblock can be updated. If the superblock has refreshed more than a predetermined number of times within a predetermined period of time, at least one of the physical blocks included as part the superblock is retired.

In yet another embodiment, blocks may be selectively retired by monitoring a number of times a superblock has been refreshed. If the superblock has refreshed at least a predetermined number of times during the given period of time, a determination is made as to which physical block within the superblock is responsible for causing the superblock to experience refresh events. After the determination is made, that physical block is retired.

In yet another embodiment, a block may be retired if it requires another refresh substantially immediately after it was just refreshed.

BRIEF DESCRIPTION OF THE DRAWINGS

The above and other aspects and advantages of the invention will become more apparent upon consideration of the following detailed description, taken in conjunction with accompanying drawings, in which like reference characters refer to like parts throughout, and in which.

DETAILED DESCRIPTION OF THE DISCLOSURE

Figure 1:
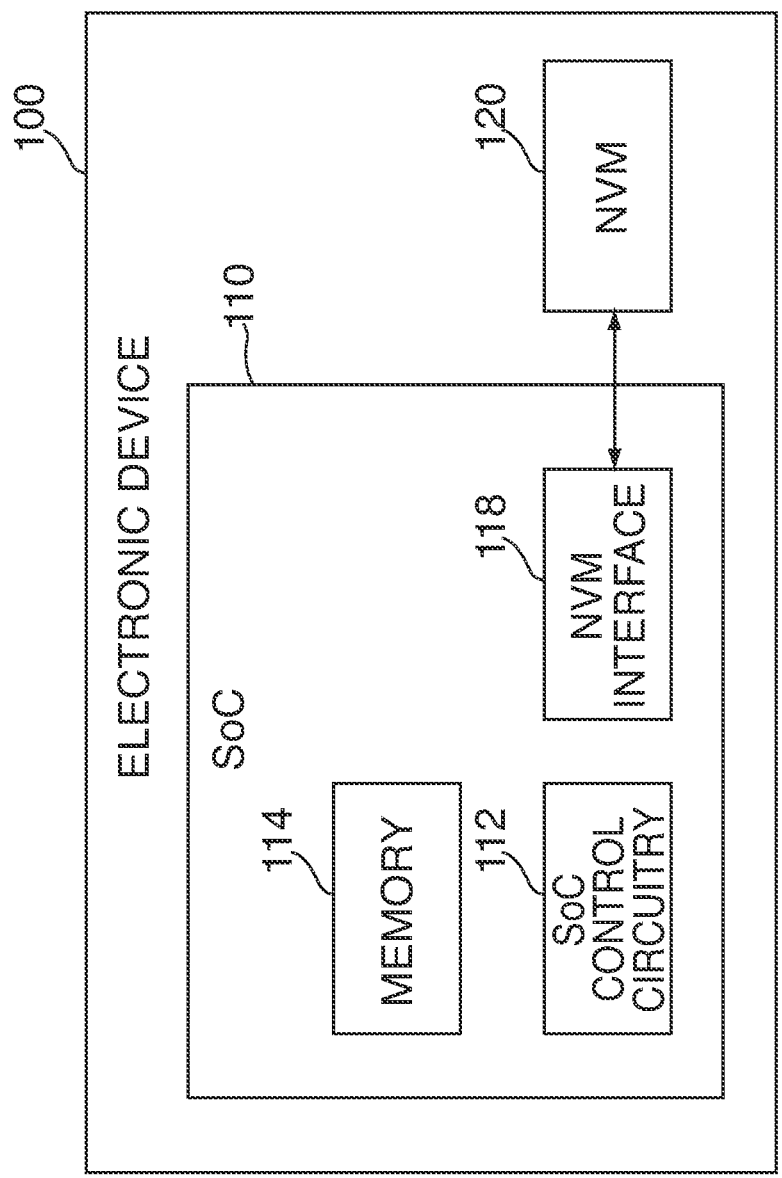
FIGS. 1 and 2 are block diagrams of electronic devices configured in accordance with various embodiments of the invention.

FIG. 1 is a schematic view of electronic device 100. In some embodiments, electronic device 100 can be or can include a portable media player (e.g., an iPod™ made available by Apple Inc. of Cupertino, Calif.), a cellular telephone (e.g., an iPhone™ made available by Apple Inc.), a pocket-sized personal computer, a personal digital assistance ("PDA"), a desktop computer, a laptop computer, and any other suitable type of electronic device.

Electronic device 100 can include system-on-a-chip ("SoC") 110 and non-volatile memory ("NVM") 120. Non-volatile memory 120 can include a NAND flash memory based on floating gate or charge trapping technology, NOR flash memory, erasable programmable read only memory ("EPROM"), electrically erasable programmable read only memory ("EEPROM"), Ferroelectric RAM ("FRAM"), magnetoresistive RAM ("MRAM"), any other known or future types of non-volatile memory technology, or any combination thereof. NVM 120 can be organized into "blocks," which are the smallest unit of erase, and further organized into "pages," which are the smallest unit to be programmed and/or read. In some embodiments, NVM 120 can include multiple integrated circuits, where each integrated circuit may have multiple blocks. The blocks from corresponding integrated circuits (e.g., blocks having the same position or block number) may form "super blocks." Each memory location (e.g., page or block) of NVM 120 can be addressed using a physical address (e.g., a physical page address or physical block address).

FIG. 1, as well as later figures and various disclosed embodiments, may sometimes be described in terms of using flash technology. However, this is not intended to be limiting, and any other type of non-volatile memory can be implemented instead. Electronic device 100 can include other components, such as a power supply or any user input or output components, which are not depicted in FIG. 1 to prevent overcomplicating the figure.

System-on-a-chip 110 can include SoC control circuitry 112, memory 114, and NVM interface 118. SoC control circuitry 112 can control the general operations and functions of SoC 110 and the other components of SoC 110 or device 100. For example, responsive to user inputs and/or the instructions of an application or operating system, SoC control circuitry 112 can issue read or write commands to NVM interface 118 to obtain data from or store data in NVM 120. For clarity, data that SoC control circuitry 112 may request for storage or retrieval may be referred to as "user data," even though the data may not be directly associated with a user or user application. Rather, the user data can be any suitable sequence of digital information generated or obtained by SoC control circuitry 112 (e.g., via an application or operating system).

SoC control circuitry 112 can include any combination of hardware, software, and firmware, and any components, circuitry, or logic operative to drive the functionality of electronic device 100. For example, SoC control circuitry 112 can include one or more processors that operate under the control of software/firmware stored in NVM 120 or memory 114.

Memory 114 can include any suitable type of volatile or non-volatile memory, such as dynamic random access memory ("DRAM"), synchronous dynamic random access memory ("SDRAM"), double-data-rate ("DDR") RAM, cache memory, read-only memory ("ROM"), or any combination thereof. Memory 114 can include a data source that can temporarily store user data for programming into or reading from non-volatile memory 120. In some embodiments, memory 114 may act as the main memory for any processors implemented as part of SoC control circuitry 112.

NVM interface 118 may include any suitable combination of hardware, software, and/or firmware configured to act as an interface or driver between SoC control circuitry 112 and NVM 120. For any software modules included in NVM interface 118, corresponding program code may be stored in NVM 120 or memory 114.

NVM interface 118 can perform a variety of functions that allow SoC control circuitry 112 to access NVM 120 and to manage the memory locations (e.g., pages, blocks, super blocks, integrated circuits) of NVM 120 and the data stored therein (e.g., user data). For example, NVM interface 118 can interpret the read or write commands from SoC control circuitry 112, perform wear leveling, and generate read and program instructions compatible with the bus protocol of NVM 120.

While NVM interface 118 and SoC control circuitry 112 are shown as separate modules, this is intended only to simplify the description of the embodiments of the invention. It should be understood that these modules may share hardware components, software components, or both. For example, a processor implemented as part of SoC control circuitry 112 may execute a software-based memory driver for NVM interface 118. Accordingly, portions of SoC control circuitry 112 and NVM interface 118 may sometimes be referred to collectively as "control circuitry."

FIG. 1 illustrates an electronic device where NVM 120 may not have its own controller. In other embodiments, electronic device 100 can include a target device, such as a flash or SD card, that includes NVM 120 and some or all portions of NVM interface 118 (e.g., a translation layer, discussed below). In these embodiments, SoC 110 or SoC control circuitry 112 may act as the host controller for the target device. For example, as the host controller, SoC 110 can issue read and write requests to the target device.

Figure 2:
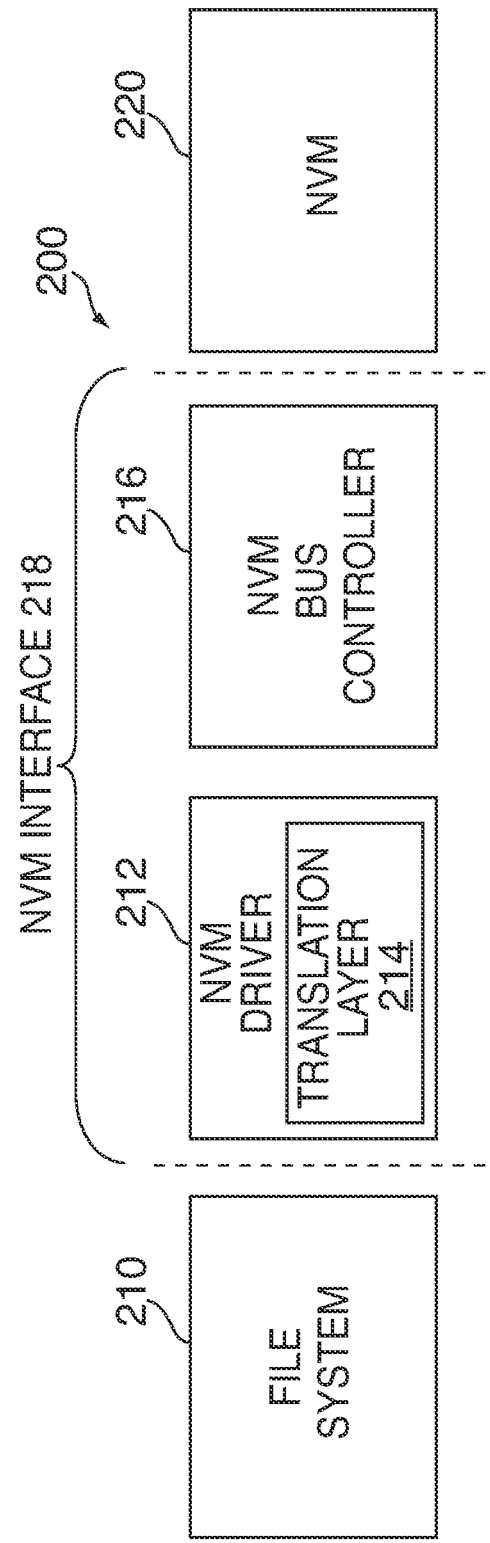

FIG. 2 is a schematic view of electronic device 200, which may illustrate in greater detail some of the firmware, software and/or hardware components of electronic device 100 (FIG. 1) in accordance with various embodiments. Electronic device 200 may have any of the features and functionalities described above in connection with FIG. 1, and vice versa. Electronic device 200 can include file system 210, NVM driver 212, NVM bus controller 216, and NVM 220. In some embodiments, file system 210 and NVM driver 212 may be software or firmware modules, and NVM bus controller 216 and NVM 220 may be hardware modules. Accordingly, in these embodiments, NVM driver 212 may represent the software or firmware aspect of NVM interface 218, and NVM bus controller 216 may represent the hardware aspect of NVM interface 218.

File system 210 can include any suitable type of file system and may be part of the operating system of electronic device 200 (e.g., part of SoC control circuitry 112 of FIG. 1). In some embodiments, file system 210 may include a flash file system, which provides a logical to physical mapping of pages. File system 210 may perform some or all of the functionalities of NVM driver 212 discussed below, and therefore file system 210 and NVM driver 212 may or may not be separate modules.

File system 210 may manage file and folder structures for the application and operating system. File system 210 may operate under the control of an application or operating system running on electronic device 200, and may provide write and read commands to NVM driver 212 when the application or operating system requests that information be read from or stored in NVM 220. Along with each read or write command, file system 210 can provide a logical address to indicate where the user data should be read from or written to, such as a logical page address or a logical block address with a page offset.

File system 210 may provide read and write requests to NVM driver 212 that are not directly compatible with NVM 220. For example, the logical addresses may use conventions or protocols typical of hard-drive-based systems. A hard-drive-based system, unlike flash memory, can overwrite a memory location without first performing a block erase. Moreover, hard drives may not need wear leveling to increase the lifespan of the device. Therefore, NVM interface 218 can perform any functions that are memory-specific, vendor-specific, or both to handle file system requests and perform other management functions in a manner suitable for NVM 220.

NVM driver 212 can include translation layer 214. In some embodiments, translation layer 214 may be or include a flash translation layer ("FTL"). On a write operation, translation layer 214 can map the provided logical address to a free, erased physical location on NVM 220. On a read operation, translation layer 214 can use the provided logical address to determine the physical address at which the requested data is stored. Because each NVM may have a different layout depending on the size or vendor of the NVM, this mapping operation may be memory and/or vendor specific. Translation layer 214 can perform any other suitable functions in addition to logical-to-physical address mapping. For example, translation layer 214 can perform any of the other functions that may be typical of flash translation layers, such as garbage collection and wear leveling.

NVM driver 212 may interface with NVM bus controller 216 to complete NVM access requests (e.g., program, read, and erase requests). Bus controller 216 may act as the hardware interface to NVM 220, and can communicate with NVM 220 using the bus protocol, data rate, and other specifications of NVM 220.

NVM interface 218 may manage NVM 220 based on memory management data, sometimes referred to herein as "metadata." The metadata may be generated by NVM driver 212 or may be generated by a module operating under the control of NVM driver 212. For example, metadata can include any information used for managing the mapping between logical and physical addresses, bad block management, wear leveling, error correcting code ("ECC") data, or any combination thereof. The metadata may include data provided by file system 210 along with the user data, such as a logical address. Thus, in general, "metadata" may refer to any information about or relating to user data or used generally to manage the operation and memory locations of a non-volatile memory. For example, metadata may be stored to assist NVM interface 218 in selectively retiring blocks in NVM 220.

NVM interface 218 may be configured to store metadata in NVM 220. In some embodiments, NVM interface 218 may store metadata associated with user data at the same memory location (e.g., page) in which the user data is stored. For example, NVM interface 218 may store user data, the associated logical address, and ECC data for the user data at one or more memory locations of NVM 220. NVM interface 218 may also store other types of metadata about the user data in the same memory location. For example, the metadata may contain a flag that indicates whether the stored data is good data.

NVM interface 218 may store the logical address so that, on power-up of NVM 220 or during operation of NVM 220, electronic device 200 can determine what data resides at that location. In particular, because file system 210 may reference the user data according to its logical address and not its physical address, NVM interface 218 may store the user data and logical address together to maintain their association. For example, in embodiments where NVM interface 218 maps logical sectors directly to physical pages, NVM interface 218 may store logical-to-physical mappings in pages in the NVM.

Figure 3:
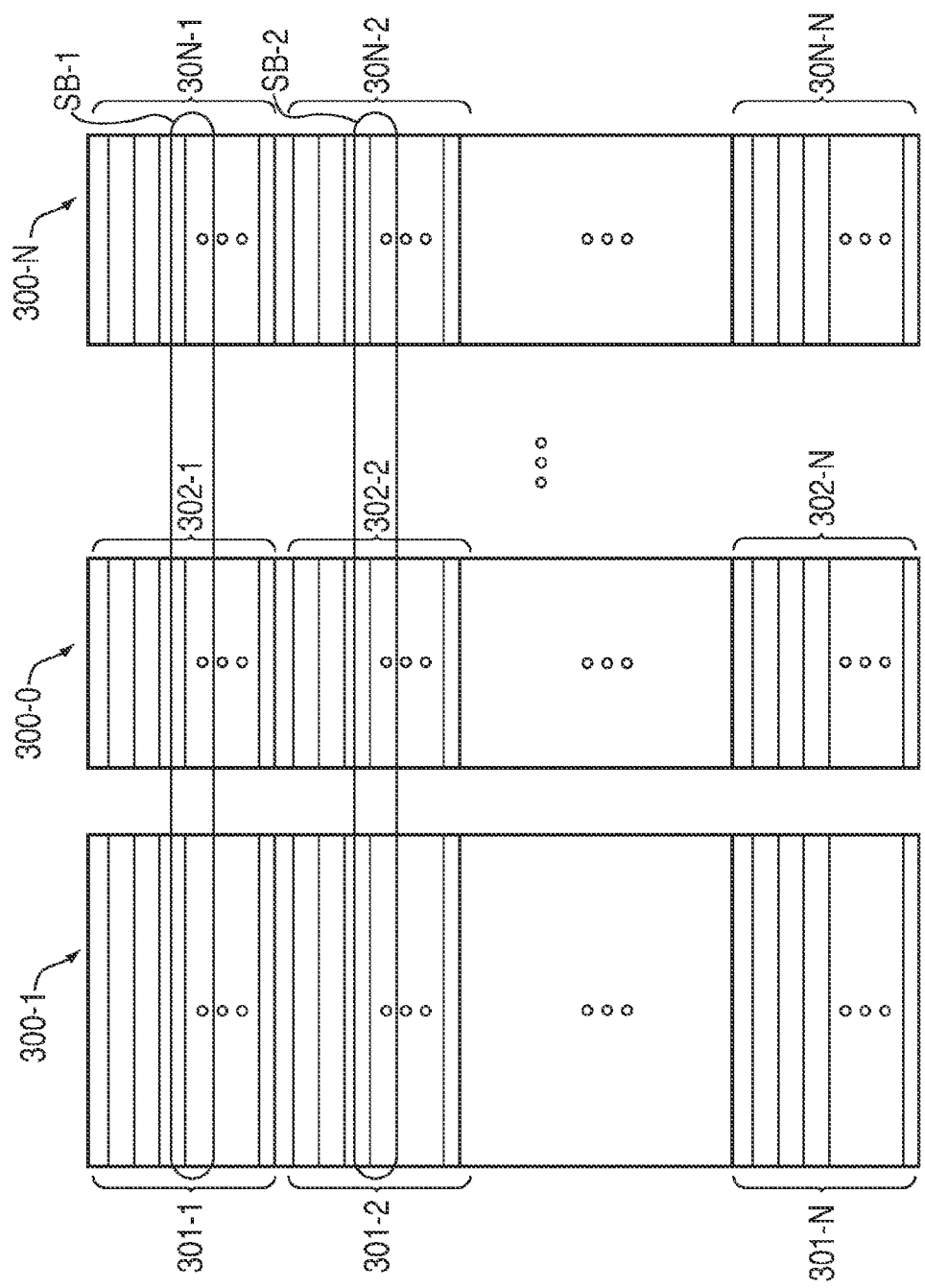
FIG. 3 is a illustrative arrangement of blocks in a NVM in accordance with various embodiments of the invention.

FIG. 3 conceptually illustrates an arrangement of NVM 300. Several planes 300-1, 300-2, and 300-N of memory cells are shown arranged in columns. Any number of planes can exist in a system. All of these planes can exist on a single integrated chip, or each plane or a group of planes (e.g., two planes) can exist in its own respective integrated chip. The planes are individually divided into blocks of memory cells, delineated by bold line rectangles, and are labeled as blocks 301-1, 301-2, 301-N, 302-1, and so on. Each block can include a predetermined number of pages, shown as smaller rectangles within each block.

Pages and blocks represent physical locations of memory cells within NVM 300. Blocks are the smallest erasable unit of memory cells and pages are smallest unit of data that can be programmed or read at a time within a block. Cells with the pages or blocks can be accessed using addressing circuitry (not shown) associated with the integrated chip or chips in which the cells reside. Only one block per plane can be accessed at any given time.

In some embodiments, blocks from two or more planes can be virtually linked together to form a superblock. For example, blocks 301-1, 302-1, and 30N-1 can be virtually linked together to form superblock SB1 and blocks 301-2, 302-2, and 30N-2 can be virtually linked together to form superblock SB2. Blocks need not be in the same row of each plane to be virtually linked as a superblock. In fact blocks may be chosen randomly from two or more planes to form a superblock. Superblocks provide operational parallelism, thereby enabling programming, reading, and erase operations to be performed on blocks located in different planes in parallel. In another embodiment, pages from two or more planes may be virtually linked together to form superpages. In some embodiments, a superblock can include only one block. A translation layer being implemented in an NVM interface may keep track of superblocks or superpages.

Figure 4:
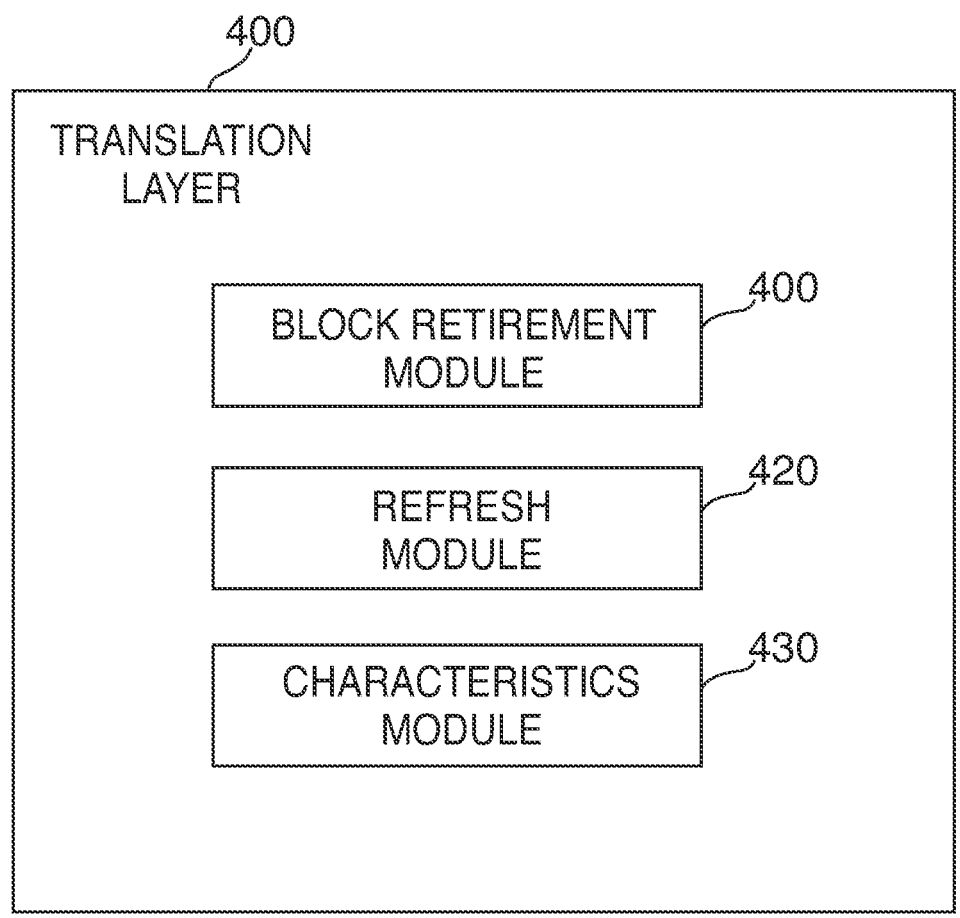
FIG. 4 is an illustrative block diagram of a translation layer in accordance with various embodiments of the invention.

Referring now to FIG. 4, an illustrative translation layer 400 is shown with block retirement module 410, refresh module 420, and characteristics module 430, each of which may communicate information to each other. Translation layer 400 may include other modules that may be used for performing various NVM management operations such as a wear leveling module, but are not included to avoid overcrowding the drawing. Although the modules are discussed as being part of a translation layer, it is understood that these module can be implemented in other parts of a NVM interface or a NVM controller. Block retirement module 410 is operative to selectively retire blocks in accordance with embodiments of the invention. Additional details on such embodiments are discussed below in connection with FIGS. 5-10.

Refresh module 420 can manage refresh events. Refresh module 420 may be responsive to signals or flags provided by the NVM indicating that a block or superblock requires a refresh. Refresh module 420 may check any information suitable for determining whether a block or superblock requires a refresh. For example, refresh module 420 may monitor an error rate such as a raw bit error rate, a modulation error rate, or a signal-to-noise ratio to determine whether a refresh is needed. In another example, refresh module may use an error-correcting scheme to make a refresh determination. In yet a further example, refresh module may check parity information when making a refresh determination. In some embodiments, refresh module 420 may maintain a list of superblocks or blocks that are refresh suspects. Block retirement module 410 may decide whether to retire blocks in the refresh list or remove blocks from the list based on various criteria. The list may be cleared when the system is reboot, thereby giving any blocks or superblocks contained therein a "free pass."

Characteristics module 430 may maintain metadata related to superblocks, blocks, or pages that the system (e.g., block retirement module 410) can use in making a determination whether to retire a block. For example, the metadata may maintain a counter of the number of times a superblock has been refreshed. Such a counter may be maintained for each superblock. When a superblock is refreshed, each physical block that forms part of the virtual superblock is refreshed. In another embodiment, a refresh counter may be maintained for each block.

Characteristics module 430 may keep track of timing information related to refresh events. For example, a timestamp may be maintained for each refresh event. The timing information may be stored in any of a variety of different formats, any of which enable the system to determine how many times a superblock or block has been refreshed within a given period of time. The timing information can include the last time a block was refreshed or an average amount time in between refresh events. The time information can also keep track of the time each page in each block was written. The timing information can be a stamp of an amount of data written counter, clock time (such as an atomic clock or system clock time), or a combination thereof.

Characteristics module 430 may keep track of the number of retired blocks in the system. Retired blocks, as defined herein, refer to blocks marked for non-use subsequent to any bad block identification made by the NVM vendor. Retired blocks are functionally equivalent to bad blocks and thus can be added to a bad block table, which is maintained by the system. In some embodiments, the metadata may keep track of the number of retired and/or bad blocks per die or per plane.

In another embodiment, characteristics module 430 the metadata may maintain a retirement block budget. The size of the budget may be set based on the capacity of the NVM, whether the NVM is 1-bit per cell, 2-bit per cell, or other multi-bit per cell Nand, the Nand vendor supplying the Nand, or any other suitable criteria. As blocks are retired, they can be counted against the retirement budget. When the budget reaches predetermined thresholds, for example, fifty percent of the budget is allocated, the system may apply more stringent criteria to slow the pace of block retirement.

Block retirement module 410, refresh module 420, and characteristics module 430 may work together to selectively retire blocks, and in particular, to selectively retire blocks based on refresh events. Moreover, modules 410, 420, and 430 operate to strike a balance between wear and performance of blocks. That is, blocks that are subject to repeated refresh events or meet retirement criteria may better serve the system by being retired, as opposed to continuing consumption of system resources to refresh the block. Refresh events are normal and expected in the management of NVM, but excessive refreshing of a block may be indicative of a physical problem with the cells in that block. Embodiments of this invention apply criteria to identify and retire blocks experiencing out of the ordinary refresh events.

Figure 5:
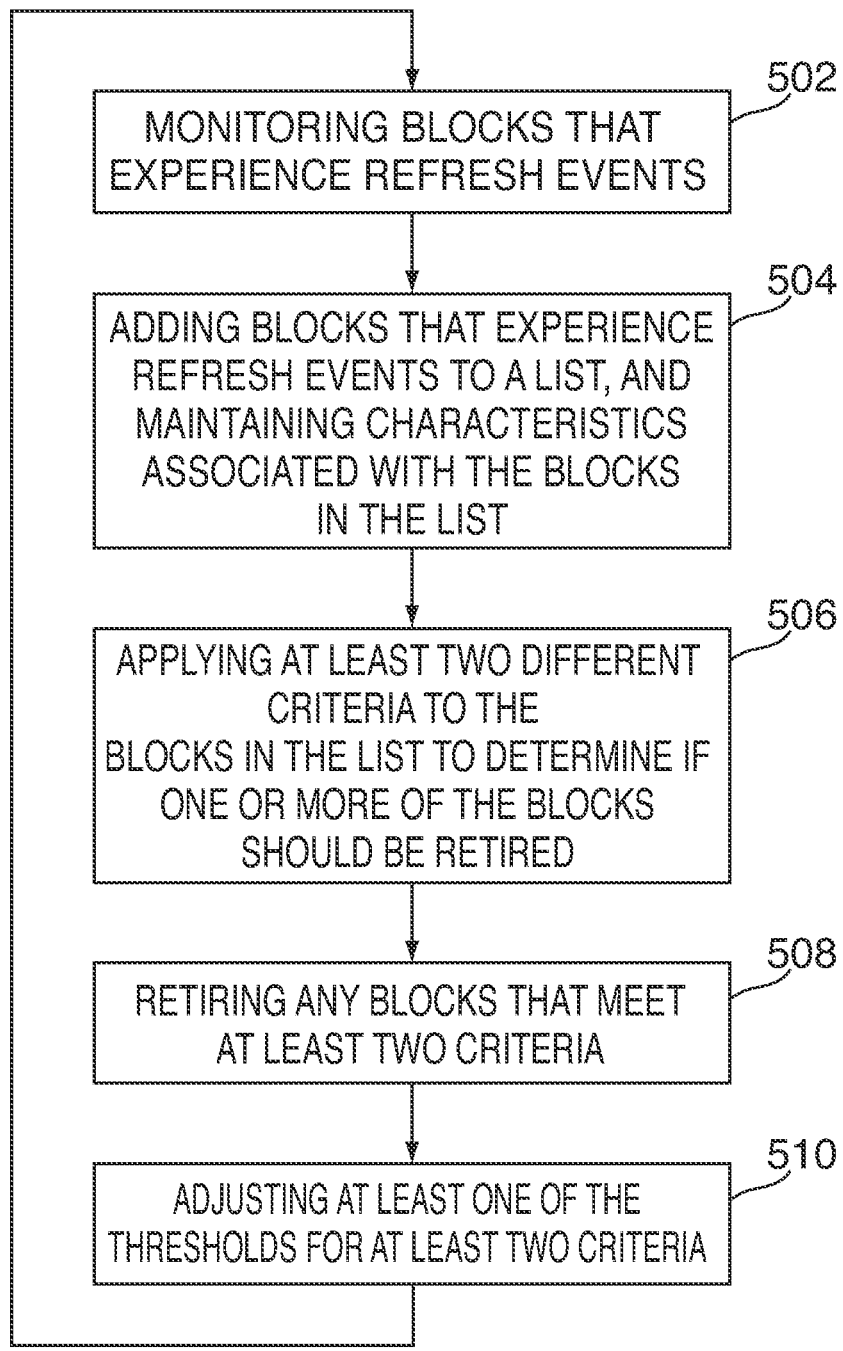
FIG. 5 shows an illustrative flowchart showing steps that may be taken to selectively retire a block in accordance with an embodiment of the invention.

FIG. 5 shows an illustrative flowchart showing steps that may be taken to selectively retire a block in accordance with an embodiment of the invention. Beginning at step 502, blocks are monitored for refresh events. The blocks being monitored can be superblocks or physical blocks. Blocks that experience refresh events can be added to a list, as indicated by step 504. In addition, characteristics associated with the blocks in the list may be maintained. The characteristics can include information such as a timestamp when the block was refreshed and a counter of the number of times the block has been refreshed. Other suitable characteristic information may be maintained such as that information discussed above in connection with characteristic module 430.

At step 506, at least two different criteria are applied to the blocks in the list to determine if any one or more of the blocks should be retired. Applying at least two different criteria can enhance the system's situational awareness and enable it to make an effective decision whether to retire a block. For example, assume that two of the criteria are refresh counts and a predetermined time period. If the number of refresh counts for a given block exceeds a predetermined count during the predetermined time period, the system may retire that block.

At step 508, any blocks that meet the at least two criteria are retired. When a block is retired, it is the physical block that is retired, not a virtual block. A block can be retired in any number of different ways. In one embodiment, the block can be flagged for retirement, in which case the block will not be retired until data is moved out of the block into a new block in a normal mode of operation (e.g., the block is selected for a garbage collection operation). When the valid data has been moved out of the block, it may then be marked as retired. In this embodiment, there is not necessarily any immediacy in retiring the block. In another embodiment, a block may be scrubbed, which substantially immediately results in having all valid data moved from that block to a new block and the block is marked as retired. Thus, in this embodiment, the block is retired substantially immediately.

At optional step 510, at least one of the threshold values for the at least two criteria is adjusted. Adjusting the threshold for one or each of the criteria gives the system flexibility in dynamically retiring blocks. For example, in one embodiment, the system may initially be configured to retire blocks that are clearly experiencing excessively high refresh events—that is to identify and retire the "low hanging fruit". After a predetermined number of blocks have been retired, the system may adjust one or more thresholds to provide a more stringent net for identifying and retiring blocks. Numerous factors can be relied on for adjusting the thresholds of the criteria, including, for example, a retirement budget, the number of retired and/or bad blocks per die or plane, or the data being stored in the block (e.g., redundant data that is also maintained in another location such as RAM may warrant stricter thresholds than data that is not redundantly stored).

Persons skilled in the art will appreciate that steps shown in FIG. 5 are merely illustrative and that additional steps may be added and that certain steps may be omitted as appropriate.

Figure 6:
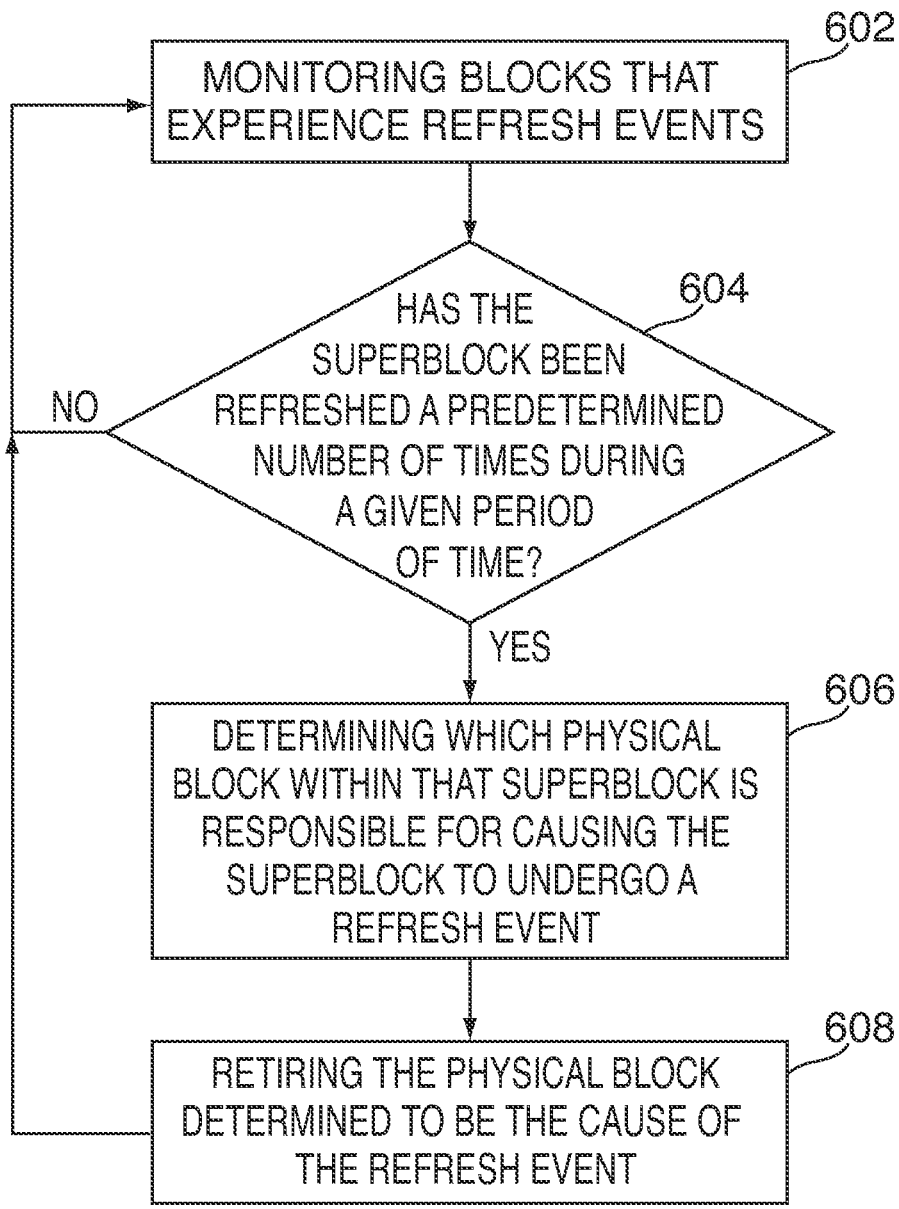
FIG. 6 shows another illustrative flow chart of steps that may be taken to selectively retire a block in accordance with an embodiment of the invention.

FIG. 6 shows an illustrative flow chart of steps that may be taken to selectively retire a block in accordance with an embodiment of the invention. Starting with step 602, the number of times a superblock has been refreshed is monitored. Maintaining refresh counts of superblocks, as opposed to physical blocks, lessens the overhead requirement. In one embodiment, the refresh count for a particular superblock may be reset if that superblock is successively programmed with data after it has been refreshed and successfully retains that data for at least a predetermined period of time. However, if the superblock is refreshed, then programmed, but still requires a refresh, the refresh count for that superblock can be incremented.

At step 604, a determination is made if that superblock has been refreshed a predetermined number of times during a given period of time. In some embodiments, a lookup table may be accessed to determine the refresh count threshold for a given period of time. For example, for a given period of time, X, the refresh count threshold may be A, but for a given period of time, Y, the refresh count threshold may be B, where X<Y, and A<B. Thus, a longer period of time can allot for a higher refresh count threshold.

The given period of time may be provided in any suitable manner. In one embodiment, the given period of time can be a fixed time (e.g., past twenty minutes or past two hours). In another embodiment, the given period time can be ascertained from the difference in two refresh event timestamps of a superblock (e.g., difference between the timestamp of the last refresh event and the timestamp of the first refresh event).

In some embodiments, the refresh threshold may be changed based on other criteria (other than a lookup table). For example, the threshold can be changed based on the length of time data has been stored in a block or superblock. As another example, an equation (taking into account any suitable criteria) may be used to determine the threshold.

If the answer to the determination made at step 604 is YES, a determination is made as to which physical block in the superblock is responsible for causing the superblock to undergo a refresh event, at step 606. As discussed above, a superblock is a virtual grouping of physical blocks. If a superblock is being refreshed, at least one of its physical blocks is the culprit. The culprit physical block can be identified, for example, by checking its parity information.

At step 608, after the physical block instigating the refresh event is determined, it is retired. If more than one physical block is identified (at step 606), additional criteria may be applied to determine which physical block should be identified. Alternatively, each of the identified blocks can be retired. As discussed above, the block can be flagged for eventual retirement or scrubbed for immediate retirement. The system can select another block from a group of spare blocks for inclusion in the superblock. The process can loop back to step 602 after step 608 is complete. If the answer to the determination made at step 604 is NO, the process can loop back to step 602.

Persons skilled in the art will appreciate that steps shown in FIG. 6 are merely illustrative and that additional steps may be added and that certain steps may be omitted as appropriate. For example, although superblocks are being monitored for refresh events, the flow chart can be modified so that physical blocks are monitored for refresh events. In this case, the step of determining which physical block is the instigator of superblock refresh events would not be needed.

Figure 7:
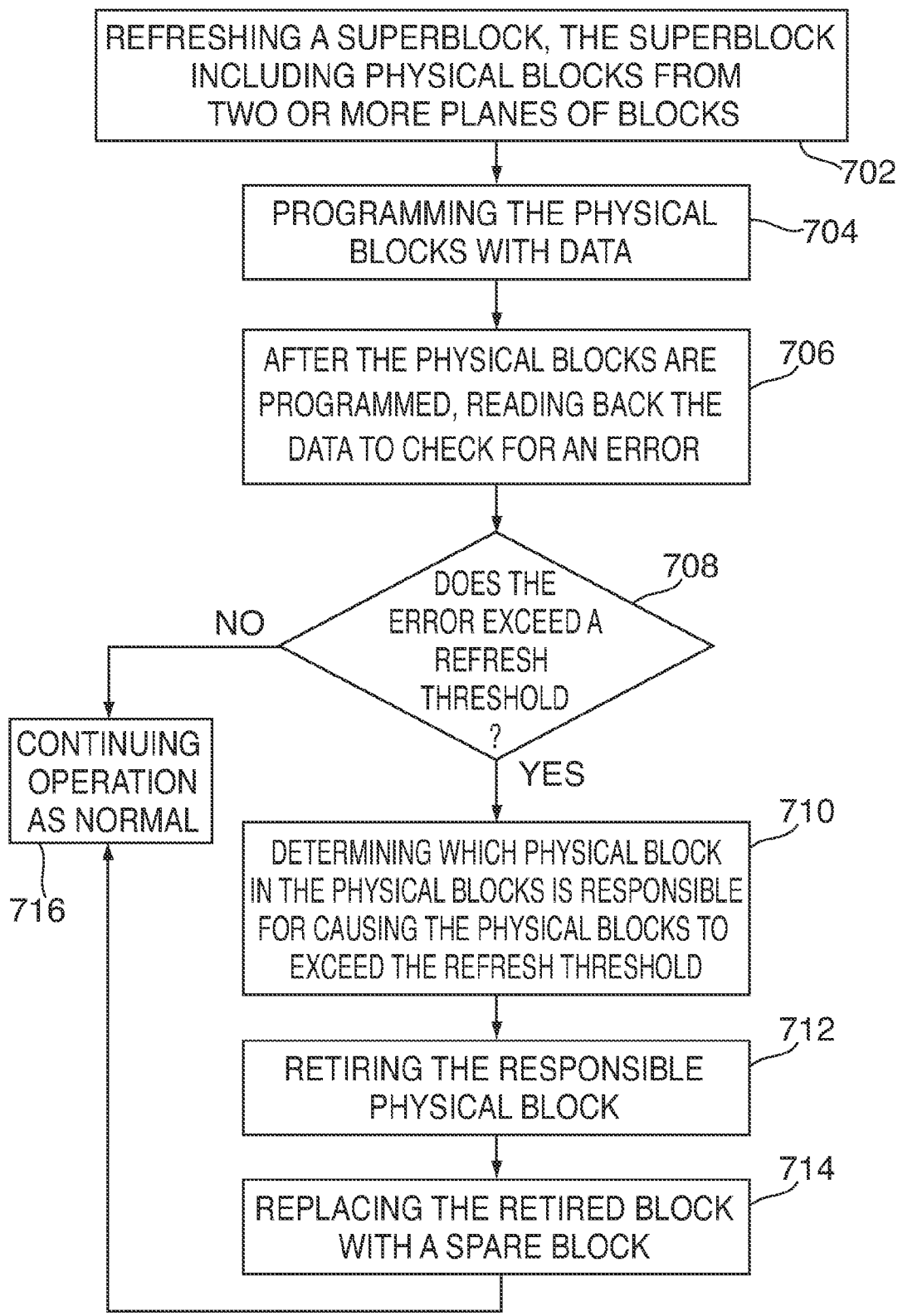
FIG. 7 shows yet another illustrative flow chart of steps that may be taken to selectively retire a block in accordance with an embodiment of the invention.

FIG. 7 shows an illustrative flow chart of steps that may be taken to selectively retire a block in accordance with an embodiment of the invention. Starting with step 702, a superblock is refreshed, the superblock including blocks from two or more planes of blocks. During a refresh operation, the data in those blocks are written to another superblock that includes different blocks from two or more planes of blocks. This process concerns the original physical blocks of the superblock that had to be refreshed, not the new physical blocks where the refreshed data is written. The original physical blocks of the superblock, or the superblock itself, may be maintained in a list. This list may keep track of the physical blocks or superblocks that have experienced a refresh event and are retirement candidates.

After the refresh event, the blocks are programmed with data at step 704. Once programmed, the data contained therein is read back to check for an error, at step 706. For example, the error being checked can be a raw bit error rate, a modulated error rate, a signal-to-noise ratio, a parity error, or any other suitable error metric. If, at step 708, the error exceeds a refresh threshold, which would ordinarily trigger another refresh of the physical blocks, the flow chart proceeds to step 710. The determination made at step 708 may involve accessing the list to determine if the physical blocks or superblock is a retirement candidate. For example, if the superblock is in the list and requires another refresh, that superblock can be marked for retirement.

At step 710, a determination is made as to which physical block in the physical blocks is responsible for causing the physical blocks to exceed the refresh threshold. At step 712, the responsible block is retired. At step 714, the retired block is replaced by a spare block available from a pool of spare blocks.

If, at step 708, the error does not exceed the refresh threshold, the system may continue operating as normal, as indicated by step 716. In addition, the physical blocks or the superblock can be removed from the list.

Figure 8:
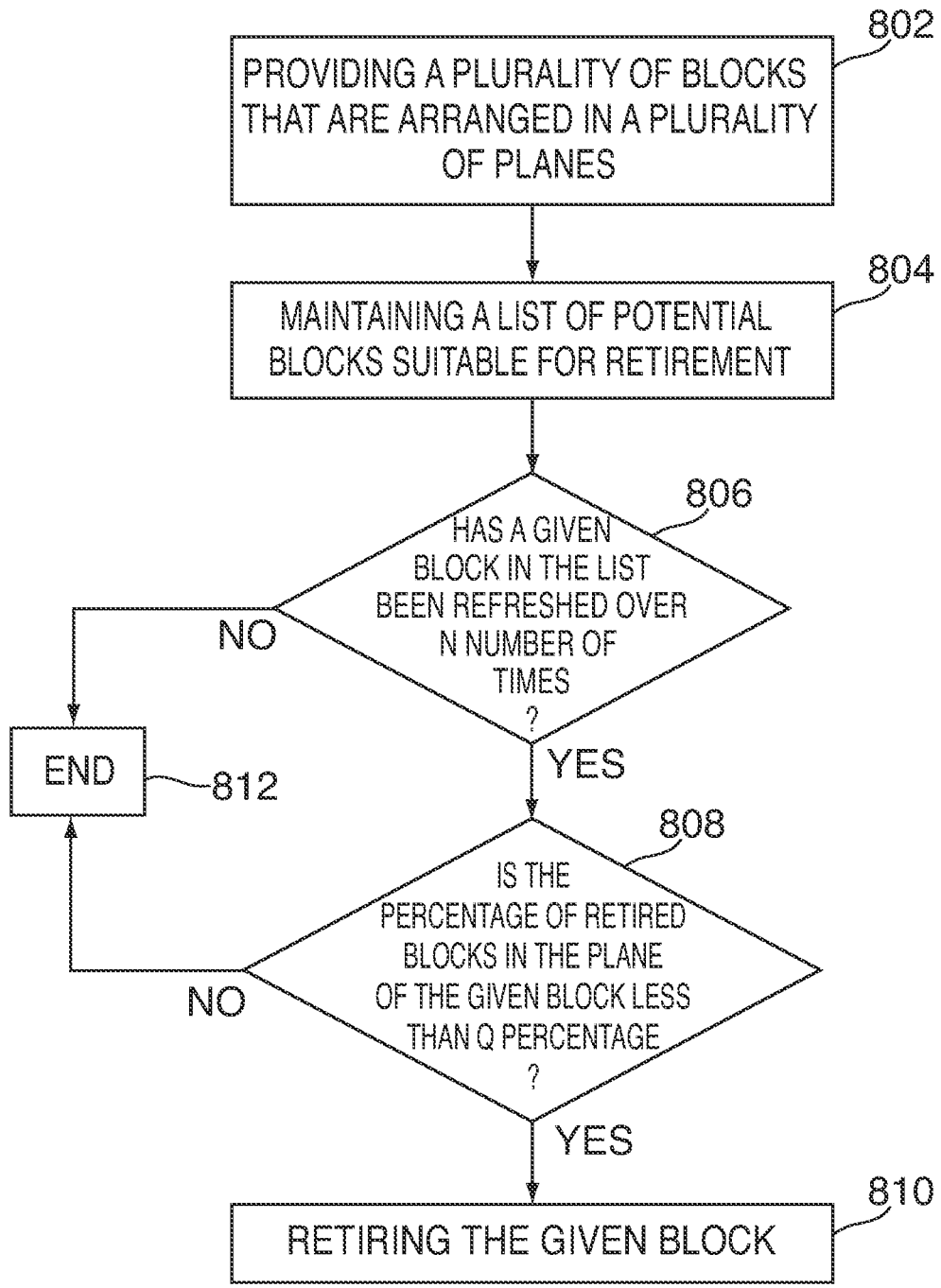
FIG. 8 shows an illustrative flow chart of steps that may be taken to selectively retire a block using characteristics information of the dies in accordance with an embodiment of the invention.

FIG. 8 shows an illustrative flow chart of steps that may be taken to selectively retire a block using characteristics information of the dies in accordance with an embodiment of the invention. As discussed above, characteristics information can provide contextual information as to the state of the system. For example, the characteristics information may indicate how many blocks have been retired or marked as bad on a per plane or per die basis. Starting with step 802, a plurality of physical blocks are arranged in a plurality of planes.

At step 804, a list of potential blocks suitable for retirement may be maintained. Blocks that meet a first threshold based on the number of times they have experienced refresh events, and, optionally, any additional criteria may be added to the list. At step 806, a determination is made if a given block in the list has been refreshed over N number of times, where N is an integer greater than zero. If desired, additional criteria may be applied to the determination being made at step 806. If the answer to the determination made at step 804 is YES, the process proceeds to step 806. If the answer, however, is NO, the process ends at step 812.

At step 808, a determination is made if the percentage of retired blocks in the plane of the given block is less than Q percentage, where Q is a number greater than zero. This determination shows that characteristic information can be referenced when the system is making a determination whether to retire a block. In this particular embodiment, the system can evaluate how many blocks have been retired for a given plane. The system may be more apt to retire blocks when the percentage of retired blocks for a given plane is relatively low, but may be less apt to retire blocks when the percentage of retired blocks for the plane is relatively high. If the determination made step at 808 is YES, the given block is retired (at step 810). If NO, then the process ends at step 812.

The determinations made at steps 806 and 808 may serve as two adjustable knobs for selecting a block for retirement, as the numbers for N and Q may be changed based on any number of factors. This two tier adjustable knob approach may ensure that "suspect" blocks that are exhibiting signs of potentially being a problem are not prematurely retired and that those "suspect" blocks that are clearly problematic are retired from further use.

Figure 9:
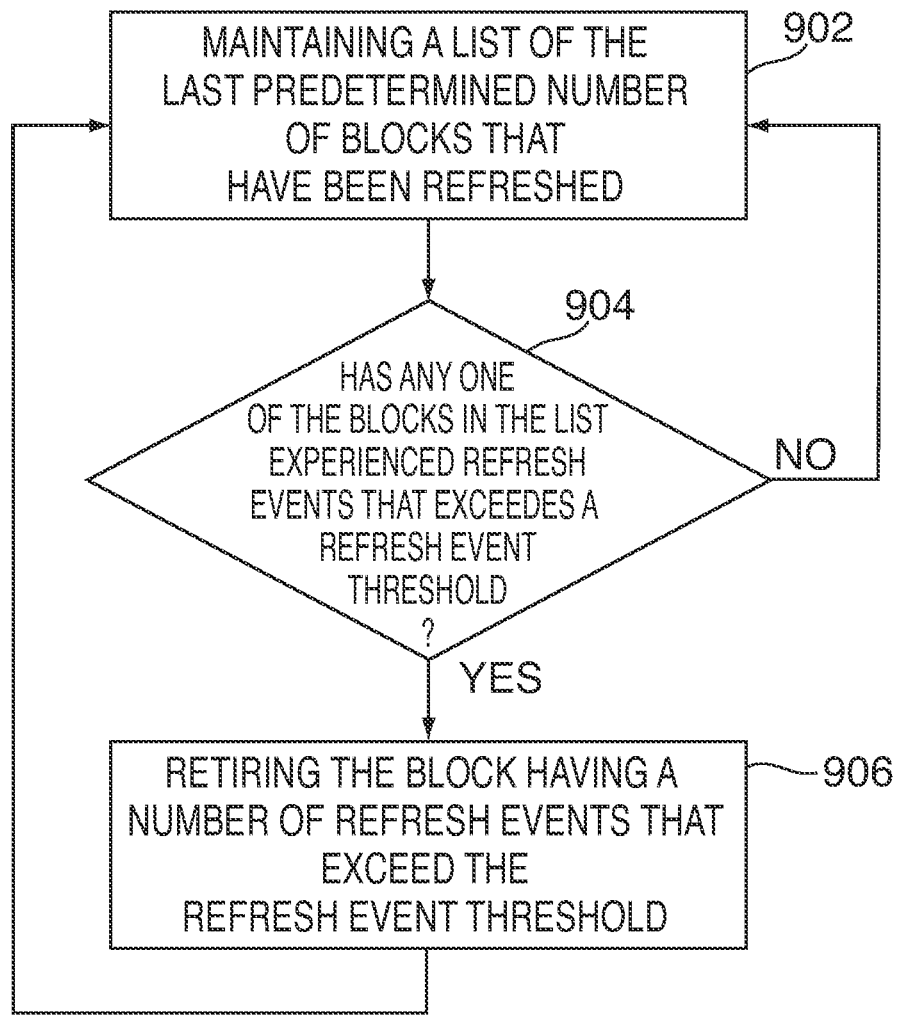
FIG. 9 shows an illustrative flow chart of steps that may be taken to selectively retire a block maintained in a list of a fixed size in accordance with an embodiment of the invention.

FIG. 9 shows an illustrative flow chart of steps that may be taken to selectively retire a block maintained in a list of a fixed size or other suitable data structure in accordance with an embodiment of the invention. For example, the list or data structure can be a tree or FIFO data structure. A list capable of only holding a fixed number of blocks can be maintained. This list may be operative to only maintain the most recently refreshed blocks. In effect, this list maintains a list of the last predetermined number of blocks that have been refreshed (step 902). In practice, blocks that are failing will tend to require a refresh more often than normally operating blocks, thus this list may include blocks that are the best candidates for retirement review. Moreover, because the list maintains an on going list of the best candidates for retirement review, this can eliminate the need to maintain metadata other than refresh counts on the blocks. Thus metadata such as time stamps of refresh events may be omitted.

At step 904, a determination is made if any one of the blocks has experienced refresh events that exceed a refresh event threshold. If the answer to step 904 is YES, then those blocks having a number of refresh events exceeding the refresh event threshold are retired (at step 906). If the answer to step 904 is NO, then the process reverts back to step 902.

Persons skilled in the art will appreciate that steps shown in FIG. 9 are merely illustrative and that additional steps may be added and that certain steps may be omitted as appropriate. For example, although blocks are being maintained in the list, the flow chart can be modified so that superblocks are maintained in the list. Maintaining a list of superblocks may require an additional step of determining which physical block or blocks within that superblock need to be retired.

Figure 10:
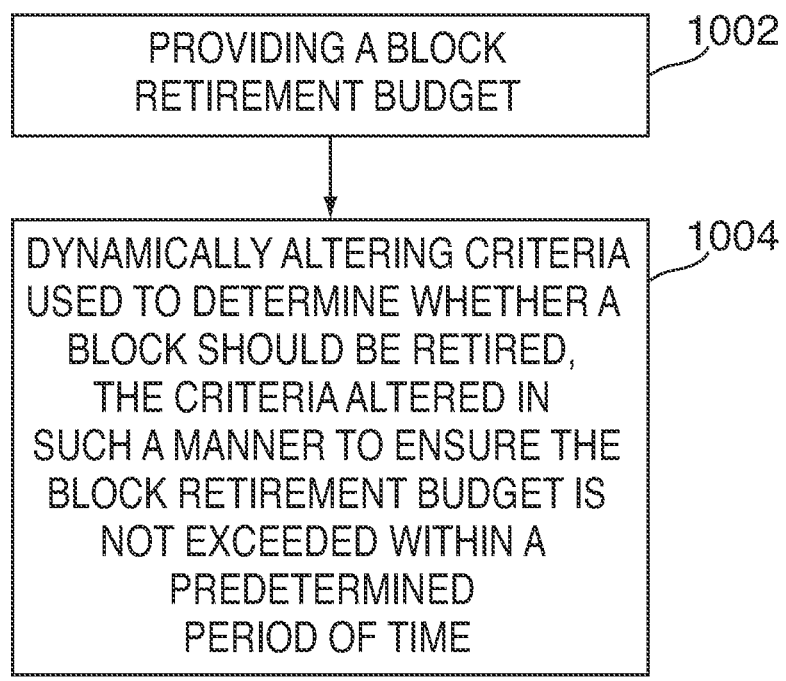
FIG. 10 shows an illustrative flow chart of steps that may be taken to selectively retire a block according to a block retirement budget in accordance with an embodiment of the invention.

FIG. 10 shows an illustrative flow chart of steps that may be taken to selectively retire a block according to a block retirement budget in accordance with an embodiment of the invention. Starting at step 1002, a block retirement budget is provided. The block retirement budget can specify the number of blocks that can be retired over the lifetime of the system. The size of the retirement budget may be based on any number of factors. For example, the size of the retirement budget may be based on the number of spare blocks available, the total memory capacity of the NVM, file system free space, or a combination thereof.

At step 1004, the criteria used to determine whether a block should be retired is dynamically altered in a manner to ensure that the block retirement budget is not exceeded within a predetermined period of time. For example, the criteria may initially be set to retire blocks that are clearly underperforming—the low hanging fruit—and after a predetermined percentage of the budget is accounted for, the system may adjust the criteria so blocks are not so readily retired.

The described embodiments of the invention are presented for the purpose of illustration and not of limitation, and the invention is only limited by the claims which follow.

What is claimed is:

1. A system comprising a processor and non-volatile memory, the processor operative to:
   monitor blocks that experience refresh events;
   add blocks that experience refresh events to a list;
   maintain characteristics associated with the blocks in the list;
   apply at least two different criteria to the blocks in the list to determine if any one or more of the blocks should be retired; and
   retire any blocks that meet the at least two criteria.

2. The system of claim 1, wherein each of the at least two different criteria has a respective threshold, the processor further operative to:
   adjust at least one of the thresholds for the at least two criteria.

3. The system of claim 1, wherein the characteristics comprise refresh count information.

4. The system of claim 1, wherein the characteristics comprise timing information.

5. A system comprising a controller and non-volatile memory, the non-volatile memory comprising a plurality of superblocks, each superblock comprising a physical block from two or more planes of physical blocks, and wherein the controller operative to:
   maintain, for each superblock, a counter of the number of times the superblock is refreshed;
   update the counter for a given superblock when the given superblock is refreshed;
   determine if the given superblock has refreshed more than a predetermined number of times within a predetermined period of time; and
   retire at least one physical block included as part of the given superblock if it is determined that the given superblock has refreshed more than the predetermined number of times within the predetermined period of time.

6. The system of claim 5, wherein the controller is further operative to maintain a timestamp of each refresh event.

7. The system of claim 5, wherein the controller is operative to determine if the given superblock has refreshed more than a predetermined number of times within a predetermined period of time substantially immediately after the given block is refreshed.

8. The system of claim 5, wherein the controller is further operative to retire at least one of the physical blocks included in the given superblock.

9. A method for selectively retiring blocks, comprising:
   providing a block retirement budget;
   dynamically altering criteria used to determine whether a block should be retired, the criteria altered in a manner to ensure that block retirement budget is not exceeded within a predetermined period of time.

10. The method of claim 9, wherein the block retirement budget specifies the number of blocks that can be retired during a lifetime of a system comprising non-volatile memory.

11. The method of claim 9, wherein a size of the block retirement budget is based on at least one of a number of spare blocks and a total memory capacity of a non-volatile memory.

12. The method of claim 9, wherein the dynamic criteria is initially set to retire blocks that are characterized as clearly underperforming.

13. The method of claim 12, wherein after a predetermined percentage of the block retirement budget is accounted for, adjusting the dynamic criteria to retire blocks at a slower rate than when a lesser percentage of the block retirement budget was accounted for.

* * * * *

UNITED STATES PATENT AND TRADEMARK OFFICE
CERTIFICATE OF CORRECTION

PATENT NO. : 8,737,148 B2  
APPLICATION NO. : 13/833229  
DATED : May 27, 2014  
INVENTOR(S) : Matthew J. Byom et al.

Page 1 of 1

It is certified that error appears in the above-identified patent and that said Letters Patent is hereby corrected as shown below:

Specification

In Column 1, Line 8, delete "8,411,519" and insert -- 8,411,519), --, therefor.

Signed and Sealed this
Twelfth Day of January, 2016

Michelle K. Lee
*Director of the United States Patent and Trademark Office*